United States Patent
Agmon

(10) Patent No.: US 8,718,998 B2
(45) Date of Patent: May 6, 2014

(54) IDENTIFYING INITIAL DON'T CARE MEMORY ELEMENTS FOR SIMULATION

(75) Inventor: Nimrod Agmon, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 560 days.

(21) Appl. No.: 13/050,255

(22) Filed: Mar. 17, 2011

(65) Prior Publication Data

US 2012/0239368 A1    Sep. 20, 2012

(51) Int. Cl.
*G06F 17/50* (2006.01)

(52) U.S. Cl.
USPC .......................................... 703/13; 716/107

(58) Field of Classification Search
USPC .............................................. 703/13; 716/107
See application file for complete search history.

(56) References Cited

U.S. PATENT DOCUMENTS

| | | | | |
|---|---|---|---|---|
| 5,493,505 A | * | 2/1996 | Banerjee et al. | 716/103 |
| 5,600,787 A | * | 2/1997 | Underwood et al. | 714/30 |
| 2002/0162066 A1 | * | 10/2002 | Khoche et al. | 714/738 |
| 2005/0155002 A1 | * | 7/2005 | Lai et al. | 716/3 |
| 2005/0229062 A1 | * | 10/2005 | Volkerink et al. | 714/738 |
| 2007/0033552 A1 | * | 2/2007 | Li | 716/4 |
| 2009/0064071 A1 | * | 3/2009 | Siarkowski et al. | 716/6 |
| 2010/0017760 A1 | * | 1/2010 | Kapur et al. | 716/2 |
| 2010/0313175 A1 | | 12/2010 | Petlin | |

OTHER PUBLICATIONS

Daniel Brand, Reinaldo A. Bergamaschi, Leon Stok, "Be Careful with Don't Cares" IEEE 1063-6757/95, 1995, pp. 83-86.*
Mike Turpin, "The Dangers of Living with an X (bugs hidden in your Verilog)," Version 1.1, Oct. 14, 2003, 34 pages.
Rajeev Ranjan, et al., "Formal Verification Enables Safe X Handling," Jasper Design Automation, downloaded on Mar. 16, 2011, 8 pages, copyrights 2000-2011.

* cited by examiner

*Primary Examiner* — Dwin M Craig
(74) *Attorney, Agent, or Firm* — Lawrence J. Merkel; Meyertons, Hood, Kivlin, Kowert & Goetzel, P.C.

(57) ABSTRACT

In an embodiment, the design of a digital circuit may be analyzed to identify which uninitialized memory elements, such as flops, have initial don't care values. The analysis may include determining that that each possible initial value (e.g. zero and one) of the flops does not impact the outputs of circuitry to which the uninitialized flops are connected. For example, a model may be generated that includes two instances of the uninitialized flops and corresponding logic circuitry. The inputs of the two instances may be connected together, and the uninitialized flops may be initialized to zero in one instance and one in the other instance. If the outputs of the two instances are equal for any input stimulus, the initial value of the uninitialized flops may be don't cares. The flops may be safely initialized to a known value for simulation.

23 Claims, 4 Drawing Sheets

US 8,718,998 B2

IDENTIFYING INITIAL DON'T CARE MEMORY ELEMENTS FOR SIMULATION

BACKGROUND

1. Field of the Invention

This invention is related to the field of simulation of digital circuit designs.

2. Description of the Related Art

An important part of digital circuit design methodology is verification of the digital circuit design. A thorough verification effort can ensure, or at least significantly improve the odds, that the digital circuit design will actually work when fabricated (e.g. as an integrated circuit or a combination of integrated circuits and/or discrete elements). A large part of the verification is typically performed by simulating the design in a simulator, applying various test stimuli and determining if the circuit is behaving as expected.

The design is typically expressed in a hardware design language (HDL) such as Verilog or VHDL. The HDL description of the design can be read by a simulator to simulate the design (or the description can be compiled into a model that the simulator can operate on to simulate the design). The simulators can be event driven simulators, cycle-based simulators, etc. These simulators will generically be referred to herein as HDL simulators, because they simulate the design based on the HDL description. The smallest element in the simulation is a logic gate (e.g. NAND, NOR, AND, OR, inverter, etc.). The logic gates can be realized in transistors, for example, but the transistors are not modeled for simulation in the HDL simulator. Instead, the logic gate is modeled. Other simulators (e.g. SPICE or SPICE-like simulators) can be used to perform simulation at the transistor level.

In HDL simulation, the various signals in the design may take on digital values (zero and one), and may also take on an X value. The X value is an undetermined value, and can occur in a simulation if an uninitialized memory location, flop, etc. is read. The X value can also occur if an input is not driven with a value. In some simulators, a high impedance value (or "Z" value) is also supported for a signal that has a weak pullup or pulldown when not actively driven.

HDL simulators that support the X value and are implemented according to an HDL standard such as the Verilog standard may be propagating the X value (representing an unknown value) even though the actual circuitry will realize a known value (e.g. binary 0 or 1). This behavior of the HDL simulator is referred to as X-pessimism. That is, unless the simulator can be certain that the unknown (i.e. X) value does not propagate from an input to an output of an element in the simulation, the unknown value is propagated as the output. For example, an AND gate having an X input and a zero input is guaranteed to have a zero output and thus the X is not propagated. However, if the other input to the AND gate is a one, the output of the AND gate is unknown and the X is propagated. In some cases, the larger circuit formed from multiple logic gates would lead to a known (non-X) output even with a particular (i.e. X) input value. However, the HDL simulation can still propagate X's depending on the underlying logic gates, because the individual gates are evaluated by the simulators according to the HDL standard (e.g. Verilog standard).

It is an increasing trend in the industry to use "uninitialized" memory elements such as flops wherever possible in the design. That is, the memory elements may not be reset to a known value. By avoiding the circuitry associated with resetting/initializing the memory element, the memory element may be implemented with less circuitry and may thus occupy less silicon area. However, coupled with the X-pessimism of the simulators as discussed above, the increased use of uninitialized memory elements often causes verification engineers to spend significant amounts of time analyzing X propagations that occur due to X-pessimism (i.e. the unknown state present in simulation and not present in the fabricated circuit).

SUMMARY

In an embodiment, the design of a digital circuit may be analyzed to identify which uninitialized memory elements, such as flops, have initial don't care values. The analysis may include determining that that each possible initial value (e.g. zero and one) of the memory elements does not impact the outputs of circuitry to which the uninitialized memory elements are connected. For example, a model may be generated that includes two instances of the uninitialized memory elements and corresponding logic circuitry. The inputs of the two instances may be connected together, and the uninitialized memory elements may be initialized to zero in one instance and one in the other instance. If the outputs of the two instances are equal for any input stimulus, the initial value of the uninitialized memory elements may be don't cares. The memory elements may be safely initialized to a known value for simulation.

In an embodiment, a formal verification tool may be used to prove that the outputs of the two instances are equal for all input stimuli. Alternatively, the model may be simulated over all combinations of the input stimuli. Any mechanism may be used to ensure that the initial values of the uninitialized memory elements are don't cares to the connected circuitry.

BRIEF DESCRIPTION OF THE DRAWINGS

The following detailed description makes reference to the accompanying drawings, which are now briefly described.

Figure 1:
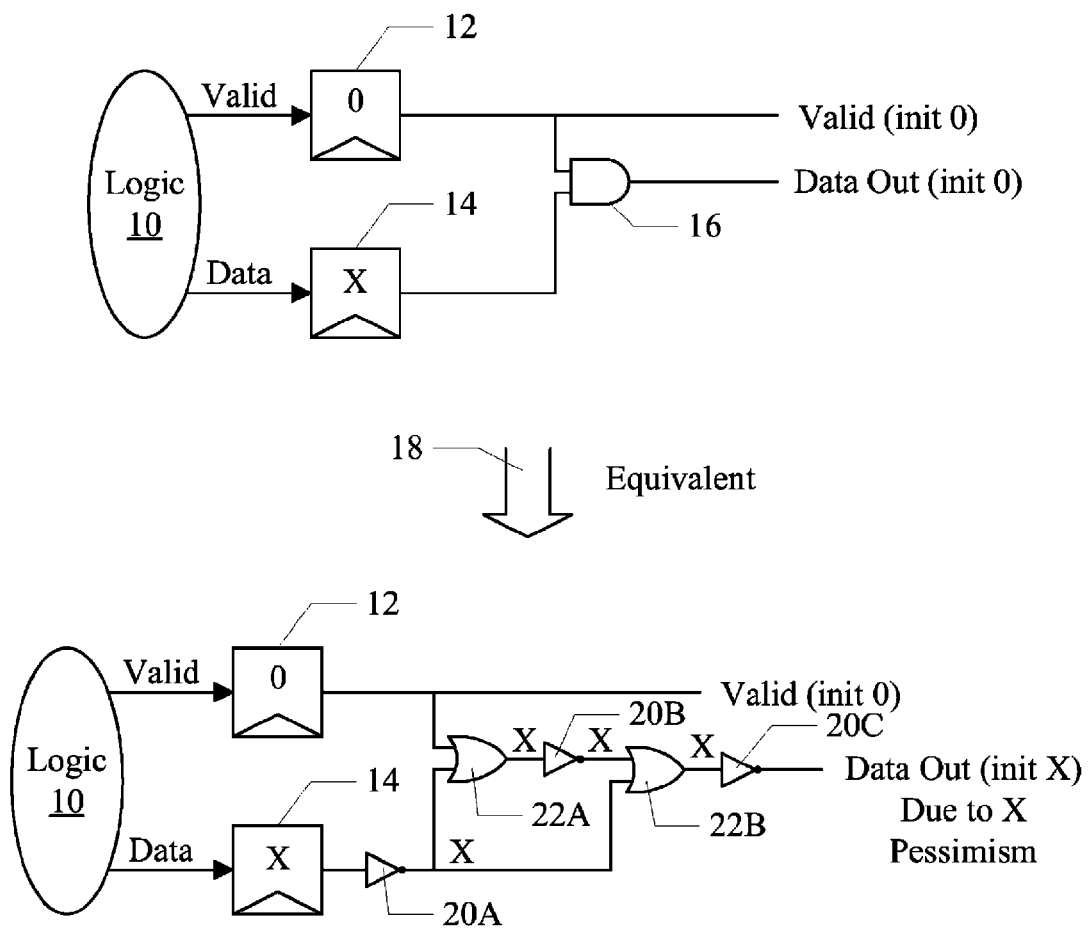
FIG. 1 is a block diagram of an example of flops and related logic circuitry.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

Detailed Description Of Embodiments

Flip-flops (or more briefly "flops") will be used as an example of a memory element in the description below. However, any memory element may be used in other embodiments, and any combination of memory elements may be used where there is more than one memory element. Memory elements may include memory arrays, storage, and any type of clocked storage device. A clocked storage device may receive a clock input, and may be configured to capture a data input and drive the data input as the data output of the device responsive to the clock signal. The clocked storage device may be configured to retain the data until the next point in the clock cycle at which data is captured by the clocked storage device. Exemplary clocked storage devices may include flops, registers, latches, etc.

Turning now to FIG. 1, a block diagram of one embodiment of flops and related circuitry is shown as an example. Two logically-equivalent circuits are shown. The first circuit includes logic 10, an initialized flop 12, an uninitialized flop 14, and an AND gate 16. The logic 10 is connected to the inputs of the flops 12 and 14, and the outputs of the flops 12 and 14 are connected to the inputs of the AND gate 16. The output of the flop 12 is provided as a valid output signal ("Valid" in FIG. 1), and the output of the AND gate 16 is a data output ("Data Out" in FIG. 1). The flop 12 receives a valid input from the logic 10, and the flop 14 receives a corresponding data value from the logic 10.

The valid output from the flop 12 may serve to validate the data from the flop 14. Viewed in another way, the valid output may qualify the data output, and receiving logic should only rely on the data if the valid output is asserted (e.g. to a logical one in this example). One way to ensure that the data is only used if the valid signal is asserted is to logically AND the valid with the data. If the valid signal is zero, the data is also zero. If the valid signal is one, the data is passed through the AND gate 16.

Because the data is validated by the valid output, the flop 14 need not be initialized. That is, as shown in FIG. 1 with the X in the flop 14, the flop 14 may have an initial value that is undefined. When the circuit is actually produced, the flop 14 may have an initial value of either zero or one, and the value may vary between power-on instances. On the other hand, the flop 12 is initialized (e.g. to zero, or not valid, in this case).

Viewed in another way, the initial value of flop 14 may not affect the result of the logic circuitry to which the flop 14 is coupled. That is, the initial value is a don't care to the logic circuitry to which the flop 14 is coupled. The result of the logic circuitry may be the same if the initial value is either binary value (0 or 1), or in a case of a multi-bit flop 14, the result is the same for any possible initial value. The logic circuitry that is connected to the output of a flop (directly or indirectly) and thus has the capability to be affected by the state of the flop in general (even if the initial value is a don't care) may be referred to as the containing logic circuit, or containing logic, for the flop.

The flop 12 may include circuitry that forces a known value into the flop during reset/circuit initialization. For example, the flop 12 may include a reset input that may be connected to a reset signal (not shown in FIG. 1). Assertion of the reset signal may force the flop 12 to a known value. Alternatively, input circuitry to the flop 12 may provide the known value to the flop 12 and the flop 12 may capture in known value prior to the end of reset. On the other hand, the flop 14 may not include the reset input or other circuitry to establish a known initial value.

An HDL simulation of the circuit may detect that the valid input to the AND gate 16 is zero when the X input is provided. Accordingly, since the X is guaranteed not to propagate to the output of the AND gate 16, the initial value of the data output is zero, even though the flop 14 is uninitialized. If other receiving logic directly receives the output of the flop 14, further analysis of a similar fashion may be used to determine if the X propagates or not.

A logically equivalent circuit (below arrow 18 in FIG. 1) includes the logic 10, the flops 12 and 14, inverters 20A-20C, and OR gates 22A-22B. The OR gate 22A has the output of the flop 12A and the output of the inverter 20A as inputs. The output of the flop 14 is the input to the inverter 20A. The output of the OR gate 22A is the input to the inverter 20B, and the outputs of the inverters 20A-20B are the inputs to the OR gate 22B, the output of which is connected to the input of the inverter 20C. The output of the inverter 20C is the data output ("Data Out").

As discussed above, the flop 14 is uninitialized and the flop 12 is initialized to zero. Since the circuit of inverters 20A-20C and OR gates 22A-22B is logically equivalent to the AND gate 16, the initial value of the data output should be zero. If the valid input is zero, the circuit of inverters 20A-20C and OR gates 22A-22B indeed produces a zero output for either a 0 or 1 initial value from the flop 14 (through the inverter 20A, the OR gate 22B and the inverter 20C if the initial value of the flop 14 is zero and through the inverter 20A, the OR gate 20A, the inverter 20B, the OR gate 22B, and the inverter 20C if the initial value of the flop 14 is one).

However, for an HDL simulator such as various event-drive simulators and/or cycle based simulators, the element at which simulation is resolved may be the logic gate. Accordingly, since the input of the inverter 20A is initially an X, its output is an X. The valid input to the OR gate 22A is a zero, so the X output from the inverter 20A propagates through the OR gate 22A and the inverter 20B. Both inputs of the OR gate 22B are thus an X, propagating an X to the output. Accordingly, even though the data output is known to be zero if the valid input is zero, the X-pessimism of the simulator may propagate an X.

Figure 2:
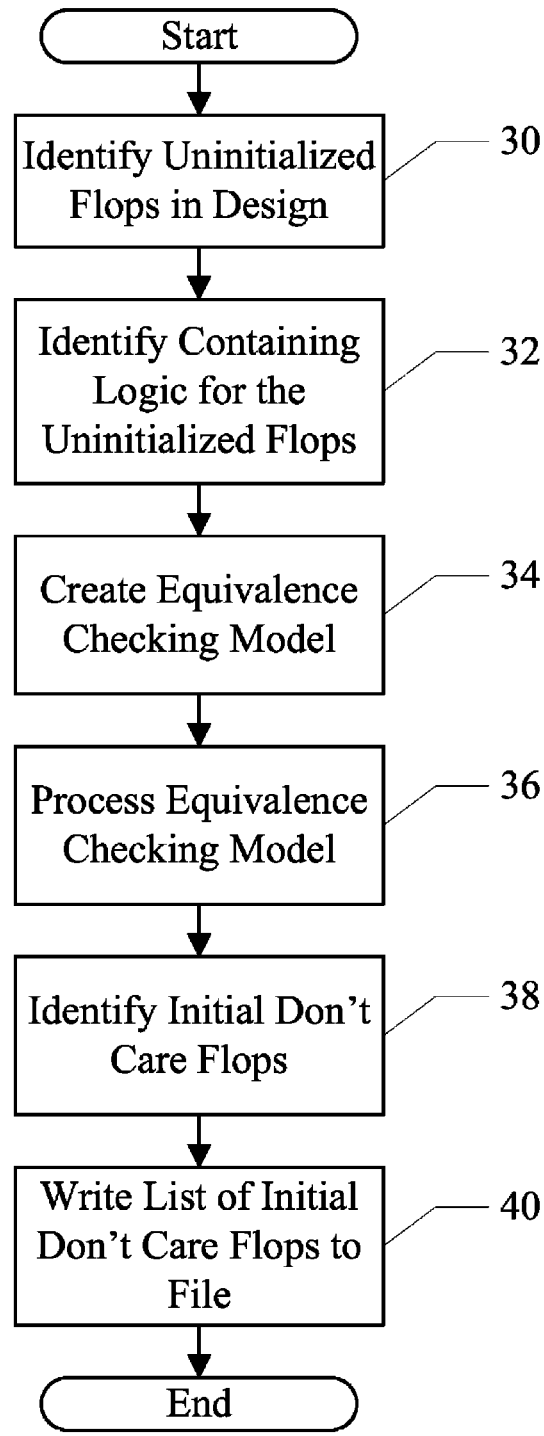
FIG. 2 is a flow chart illustrating one embodiment of identifying initial don't care memory elements.

FIG. 2 illustrates one embodiment of a method for identifying uninitialized flops for which the initial value is a don't care, referred to as initial don't care (IDC) flops herein. While the blocks are shown in a particular order for ease of understanding, other orders may be used. Various components of the flowchart may be implemented by executing program instructions on a computer (such as the computer shown in FIG. 6). Such blocks may be performed by executing the instructions associated with that block. In one embodiment, the operation of the flowchart of FIG. 2 may be implemented in a formal verification tool. However, any tool or any plurality of instructions may be used in various embodiments. Generally, a software tool may include instructions which, when executed, implement the operation described for the tool. A tool may thus be a program.

A formal verification tool may be a tool that is configured to formally verify a digital logic circuit. Formal verification may generally refer to proving or disproving a digital logic circuit's ability to meet a formal specification for the behavior/properties of the circuit. In contrast, simulation generally refers to executing various test vectors, or test stimuli, against the circuit. The results of the simulation may be compared to expected results of the circuit to determine if the correct behavior is being observed.

The formal verification tool may identify the uninitialized flops in the design (block 30). The flops may be identified, for example, by searching one or more hardware description language (HDL) descriptions associated with the design. For example, designs are often described as register-transfer level (RTL) descriptions in the HDLs (such a VHDL or Verilog). Uninitialized flops may be identified as those that do not have reset inputs, or as those whose input circuitry does not receive a reset input and thus is not affected by the reset. In some embodiments, designers may be permitted to annotate the description to identify uninitialized flops. The formal verification tool may identify the containing logic for the uninitialized flops (block 32). Various algorithms for tracing the containing logic may be used.

Figure 3:
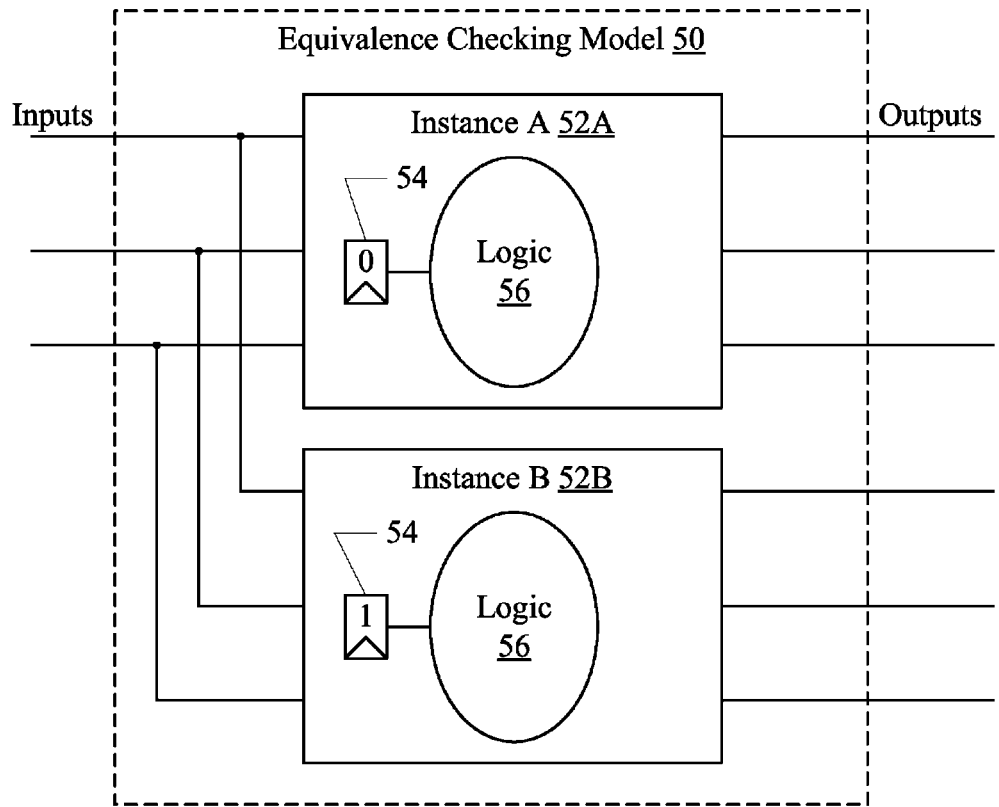
FIG. 3 is a block diagram illustrating one embodiment of an equivalence checking model.

Using the containing logic and the uninitialized flops (and additional flops that are initialized but may also supply the containing logic or are part of the containing logic), the formal verification tool may create an equivalence checking model (block 34). An equivalence checking model may be any model that may be used to check the logical equivalence between two (or more) circuits. One example of an equivalence checking model is shown in FIG. 3 and described in more detail below. Other embodiments may implement the equivalence checking model in other ways. Generally, the two models being checked for equivalence may include initializing the uninitialized flops to different states. If the outputs are not affected by the different initializations of the uninitialized flops, the uninitialized flops are IDC flops. In one embodiment, there may be one equivalence checking model for each uninitialized flop and its corresponding containing logic. Other embodiments may be able to identify multiple flops that may be included in the same equivalence checking model.

The formal verification tool may process the equivalence checking models, attempting to prove that the uninitialized flops are IDC flops (block 36). Those flops that are proven to be IDC flops may thus be identified (block 38). Those flops that are not proven to be IDC flops may not be identified as such, and thus may be simulated without initialization. It may be the case that the flops which cannot be proven to be IDC flops are, in fact, initial don't care flops. However, the formal verification tool may not be able to prove that the flops are IDC flops (e.g. the containing logic circuitry may be too complex for the formal verification tool to handle). The formal verification tool may write a list or other identifying representation of the IDC flops to a file to be used during simulation, as described in more detail below (block 40).

It is noted that other embodiments may not implement the flowchart of FIG. 2 (or portions thereof) in a formal verification tool. For example, some embodiments may implemented blocks 30, 32, and/or 34 in stand-alone software the may be executed prior to the formal verification tool. Blocks 38 and 40 may be implemented in post processing software after the operation of the formal verification tool. Additionally, in other embodiments, other mechanisms besides the formal verification tool may be used to process the equivalence checking model. For example, simulation over all combinations of inputs (or all possible or legal combinations of inputs, if some input combinations are not permitted) may be used with comparisons of the outputs to identify the IDC flops.

Turning next to FIG. 3, a block diagram of one embodiment of an equivalence checking model 50 is shown. In the illustrated embodiment, the equivalence checking model 50 includes two instances (A and B) 52A-52B of the uninitialized flop 54 and corresponding containing logic 56. As mentioned previously, in some embodiments, the containing logic 56 may include initialized flops. Alternatively, the initialized flops may be instantiated outside of the containing logic 56 (not shown in FIG. 3). In another alternative, outputs of the initialized flops may be inputs to the instances 52A-52B if the outputs of the initialized flops are inputs to the logic 56/flops 54 and inputs of the initialized flops may be outputs of the instances 52A-52B if the inputs of the initialized flops are driven by the logic 56/flops 54.

As illustrated in FIG. 3, the inputs to the instances are connected together. That is, since the instances include the same flop 54 and logic 56, the instances also include the same input signals and output signals. Corresponding input signals of each instance 54A-54B are connected together, and thus the input stimulus to each instance 54A-54B is the same. The outputs of the instances 54A-54B may be output from the model 50, and respective outputs may be compared for equality.

In the instances 52A-52B, for equivalence checking purposes, the uninitialized flop 54 is initialized to a known value. The flop 54 is initialized to one binary value in the instance 52A and the opposite binary value in the instance 52B. For example, in the illustrated embodiment, the flop 54 is initialized to zero in the instance 52A and to one in the instance 52B.

Figure 4:
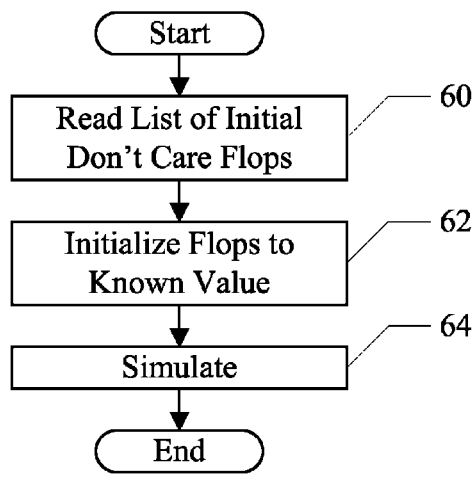
FIG. 4 is a flowchart illustrating one embodiment of simulating a digital design including initial don't care memory elements.

Turning now to FIG. 4, a flowchart is shown illustrating operation of one embodiment of a simulator tool to simulate a digital circuit design. While the blocks are shown in a particular order for ease of understanding, other orders may be used. Various components of the flowchart may be implemented by executing program instructions on a computer (such as the computer shown in FIG. 6). Such blocks may be performed by executing the instructions associated with that block.

The simulator tool may read the file containing the list of IDC flops (block 60), and may initialize the IDC flops to a known value (block 62). The known value may be any value in various embodiments (e.g., all zeros, all ones, or any other value). Each IDC flop may be initialized to the same value, or to different values. The simulator tool may simulate the digital circuit design with the IDC flops initialized (block 64). The amount of X propagation due to X pessimism may be reduced via the initialization of the IDC flops, which may reduce the amount of debugging by the verification engineers and/or designers in some embodiments.

Computer Accessible Storage Medium and System

Figure 5:
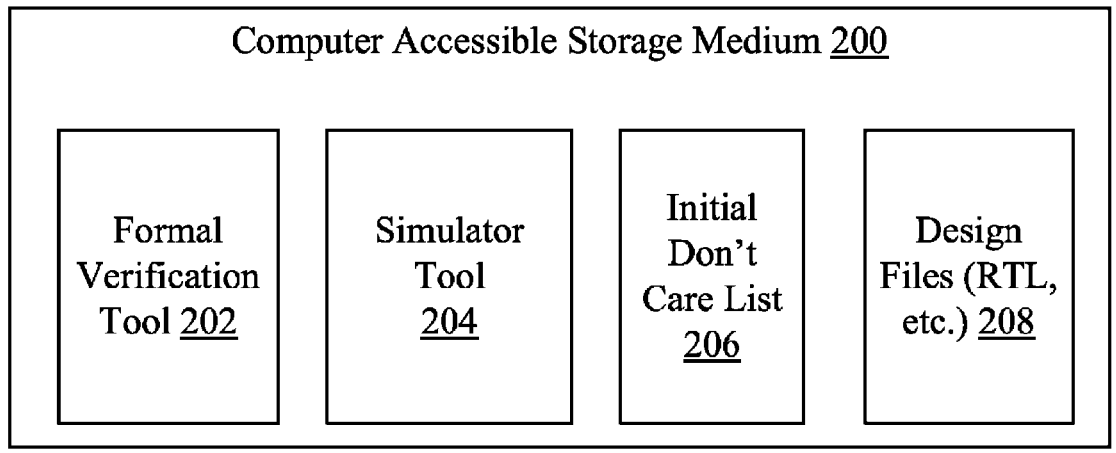
FIG. 5 is a block diagram of one embodiment of a computer accessible storage medium.

Turning now to FIG. 5, a block diagram of a computer accessible storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. Storage media may also include non-volatile memory (e.g. Flash memory) accessible via a peripheral interface such as the Universal Serial Bus (USB) interface, a flash memory interface (FMI), a serial peripheral interface (SPI), etc. Storage media may include microelectromechanical systems (MEMS), as well as storage media accessible via a communication medium such as a network and/or a wireless link.

The computer accessible storage medium 200 in FIG. 5 may store a formal verification tool 202, a simulator tool 204, an initial don't care list 206 (a file stored on the medium 200), and/or one or more design files 208 (e.g. RTL or other HDL descriptions, net lists, schematics, and/or general data set II (GDSII) data describing mask objects, etc.). The formal verification tool 202 may include instructions which, when executed on a computer, implement the operation described for the formal verification tool above. Similarly, the simulator tool 204 may include instructions which, when executed on a computer, implement the operation described for the simulator tool above. The formal verification tool 202 and/or the synthesis tool 204 may include any commercially-available tools from a variety of different vendors (e.g. Synopsys, Cadence, etc.). In cases in which some of FIG. 2 is implemented in a standalone program, such program may be stored on the medium 200 also. A carrier medium may include computer accessible storage media as well as transmission media such as wired or wireless transmission.

Figure 6:
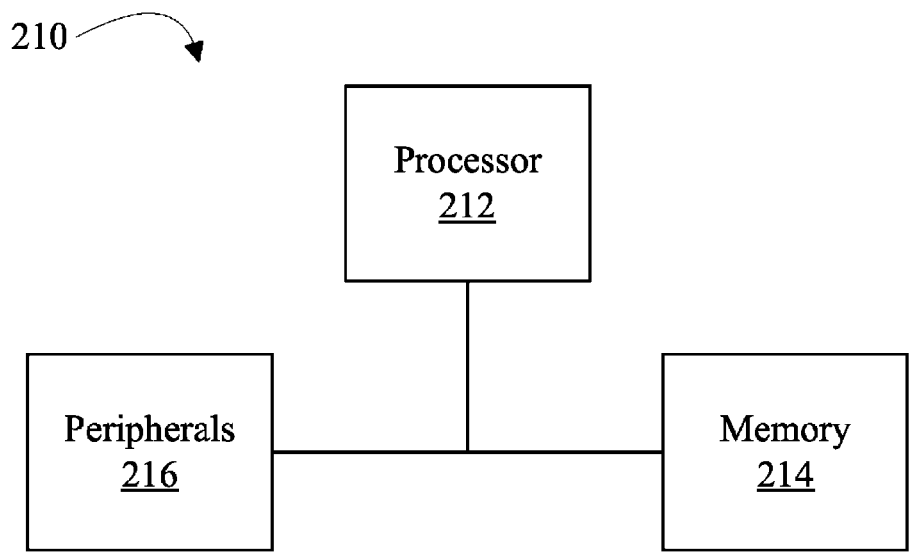
FIG. 6 is a block diagram of one embodiment of a computer system.

FIG. 6 is a block diagram of one embodiment of an exemplary computer system 210. In the embodiment of FIG. 6, the computer system 210 includes a processor 212, a memory 214, and various peripheral devices 216. The processor 212 is coupled to the memory 214 and the peripheral devices 216.

The processor 212 is configured to execute instructions, including the instructions in the software described herein such as the tools 202 and 204. In various embodiments, the processor 212 may implement any desired instruction set (e.g. Intel Architecture-32 (IA-32, also known as x86), IA-32 with 64 bit extensions, x86-64, PowerPC, Sparc, MIPS, ARM, IA-64, etc.). In some embodiments, the computer system 210 may include more than one processor.

The processor 212 may be coupled to the memory 214 and the peripheral devices 216 in any desired fashion. For example, in some embodiments, the processor 212 may be coupled to the memory 214 and/or the peripheral devices 216 via various interconnect. Alternatively or in addition, one or more bridge chips may be used to coupled the processor 212, the memory 214, and the peripheral devices 216.

The memory 214 may comprise any type of memory system. For example, the memory 214 may comprise DRAM, and more particularly double data rate (DDR) SDRAM, RDRAM, etc. A memory controller may be included to interface to the memory 214, and/or the processor 212 may include a memory controller. The memory 214 may store the instructions to be executed by the processor 212 during use, data to be operated upon by the processor 212 during use, etc.

Peripheral devices 216 may represent any sort of hardware devices that may be included in the computer system 210 or coupled thereto (e.g. storage devices, optionally including a computer accessible storage medium 200, other input/output (I/O) devices such as video hardware, audio hardware, user interface devices, networking hardware, etc.).

Numerous variations and modifications will become apparent to those skilled in the art once the above disclosure is fully appreciated. It is intended that the following claims be interpreted to embrace all such variations and modifications.

What is claimed is:

1. A method comprising:
a computer analyzing a design to identify which uninitialized memory elements in the design have an initial value that is a don't care to the logic which is connected to the uninitialized memory elements, wherein analyzing the design comprises:
creating a model that includes a first instance of at least one of the uninitialized memory elements and corresponding containing logic and a second instance of the at least one of the uninitialized memory elements and corresponding containing logic, wherein corresponding inputs of the first instance and the second instance are connected together, wherein the corresponding containing logic is the logic that is coupled to an output of the at least one of the uninitialized memory elements;
initializing the at least one of the uninitialized memory elements to one binary value in the first instance and the opposite binary value in the second instance; and
processing the model to determine whether or not outputs of the first instance match outputs of the second instance for all input stimuli, wherein the input stimuli are provided on input signals to the first instance and the second instance, wherein the input signals are connected to one or both of the inputs to the at least one uninitialized memory elements and the containing logic;
wherein the at least one of the uninitialized memory element are included in the identified uninitialized memory elements responsive to the outputs of the first instance matching the outputs of the second instance for all input stimuli; and
a computer simulating the design, wherein the simulating includes initializing the identified uninitialized memory elements to a known value.

2. The method as recited in claim 1 wherein the known value is the same for each identified uninitialized memory element.

3. The method as recited in claim 1 wherein the analyzing further comprises:
identifying the uninitialized memory elements in the design; and
identifying the containing logic for the uninitialized memory elements.

4. The method as recited in claim 1 further comprising:
storing, in a file on the computer, a list of the uninitialized memory elements in the design having the initial value that is the don't care; and
the simulating comprising reading the file to initialize the uninitialized memory elements in the design having the initial value that is the don't care.

5. The method as recited in claim 1 wherein processing the model comprises performing formal verification on the model.

6. The method as recited in claim 1 wherein processing the model comprises simulating the model over all input stimuli.

7. A non-transitory computer accessible storage medium storing a plurality of instructions which, when executed on a computer:
identify a plurality of uninitialized flops in a digital circuit design;

identify containing logic for the plurality of uninitialized flops in the design, wherein the containing logic is the logic that is coupled to outputs of the plurality of uninitialized flops;

identify one or more flops in the plurality of uninitialized flops whose initial values do not impact a result of operation of the containing logic;

form equivalence checking models for the plurality of uninitialized flops and the containing logic; and process the equivalence checking models, wherein identifying the one or more flops is responsive to processing the equivalence models, wherein the equivalence checking models include a first instance of the plurality of uninitialized flops and the containing logic and a second instance of the plurality of uninitialized flops and the containing logic, wherein each input of the first instance is connected to a corresponding input of the second instance, and wherein at least a first flop in the first instance of the plurality of uninitialized flops is initialized to a first binary value, and wherein the first flop in the second instance is initialized to a second binary value that is opposite of the first binary value, and wherein processing the equivalence checking models comprises ensuring that the outputs of the first instance and the outputs of the second instance are the same for any input stimulus to identify the first flop as one of the one or more flops whose initial value does not impact a result of operation of the containing logic, wherein the input stimulus is provided on input signals to the first instance and the second instance, wherein the input signals are connected to one or both of the inputs to plurality of uninitialized flops and the containing logic.

8. The non-transitory computer accessible storage medium as recited in claim 6 wherein the plurality of instructions, when executed:

write a file on the computer accessible storage medium with an indication of the one or more flops;

read the file at a start of a simulation of the design; and initialize the one or more flops to a known value at the start of the simulation.

9. The non-transitory computer accessible storage medium as recited in claim 8 wherein other ones of the plurality of uninitialized flops have an unknown value at the start of the simulation.

10. The non-transitory computer accessible storage medium as recited in claim 7 wherein the processing of the equivalence checking models is performed by a formal verification tool.

11. The non-transitory computer accessible storage medium as recited in claim 7 wherein the processing of the equivalence models comprises simulating the equivalence checking models over all possible combinations of the inputs, and wherein ensuring that the outputs of the first instance and the outputs of the second instance are the same for any input stimulus comprises comparing the outputs during the simulating.

12. A computer system comprising:

a processor configured to execute instructions; and a non-transitory computer accessible storage medium storing a plurality of instructions to be executed by the processor, wherein the plurality of instructions, when executed:

identify a plurality of uninitialized clocked storage devices in a digital circuit design;

identify containing logic circuitry for the plurality of uninitialized clocked storage devices, wherein the containing logic circuitry is the logic circuitry that is coupled to outputs of the plurality of uninitialized clocked storage devices;

create equivalence checking models for the plurality of uninitialized clocked storage devices and the containing logic, wherein the equivalence checking models include a first instance of the plurality of uninitialized clocked storage devices and the containing logic circuitry and a second instance of the plurality of uninitialized clocked storage devices and the containing logic circuitry, wherein each input of the first instance is connected to a corresponding input of the second instance, and wherein at least a first clocked storage device in the plurality of uninitialized clocked storage devices is initialized to a first binary value in the first instance, wherein the first clocked storage device is initialized to a second binary value in the second instance, wherein the second binary value is a complement of the first binary value;

process the equivalence checking models, wherein processing the equivalence checking models comprises ensuring that the outputs of the first instance and the outputs of the second instance are the same for any input stimulus, wherein the input stimulus is provided on input signals to the first instance and the second instance, wherein the input signals are connected to one or both of the inputs to the plurality of uninitialized clocked storage devices and the containing logic circuitry; and identify a subset of the plurality of uninitialized clocked storage devices, wherein the subset are determined in the processing of the equivalence checking models to have initial values that are don't cares to the containing logic, and wherein the first clocked storage device is in the subset if the outputs of the first instance and the outputs of the second instance are the same for any input stimulus.

13. The computer system as recited in claim 12 wherein the plurality of instructions include a formal verification tool that performs the processing of the equivalence checking models.

14. The computer system as recited in claim 12 wherein the plurality of instructions include a simulation tool that performs the processing of the equivalence checking models by simulating all valid combinations of the inputs and comparing the outputs of the first instance to the outputs of the second instance to detect equality.

15. The computer system as recited in claim 12 wherein the plurality of instructions, when executed:

initialize the subset of the plurality of uninitialized clocked storage devices to an initial known value; and simulate the design using the initial known value.

16. The computer system as recited in claim 15 wherein the initial known value is the same value for each of the subset of the plurality of uninitialized clocked storage devices.

17. The computer system as recited in claim 12 wherein the plurality of uninitialized clocked storage devices comprise a plurality of flops.

18. A method comprising:

a computer analyzing a digital circuit design to identify which uninitialized memory elements in the digital circuit design have an initial value that does not impact a result of a containing logic circuit, wherein analyzing the design comprises:

creating a model that includes at least a first instance and a second instance of at least one of the uninitialized memory elements and the containing logic circuit, wherein corresponding inputs of the first instance and the second instance are connected together, wherein the containing logic circuit is the logic circuit that is coupled to an output of the at least one of the uninitialized memory elements;

initializing the at least one of the uninitialized memory elements to a first binary value in the first instance and a second binary value in the second instance, wherein the second binary value is an inversion of the first binary value; and processing the model to determine whether or not outputs of the first instance match outputs of the second instance for all input stimuli, wherein the input stimuli are provided on input signals to the first instance and the second instance, wherein the input signals are connected to one or both of the inputs to the at least one uninitialized memory elements and the containing logic circuit;

wherein the at least one of the uninitialized memory elements are included in the identified uninitialized memory elements if the outputs of the first instance do match the outputs of the second instance for all input stimuli; and a computer simulating the design, wherein the simulating includes initializing the identified uninitialized memory elements.

19. The method as recited in claim 18 wherein initializing is to a same value for each identified uninitialized memory elements.

20. The method as recited in claim 18 wherein the analyzing further comprises:
identifying the uninitialized memory elements in the design; and
identifying the containing logic for the uninitialized memory elements.

21. The method as recited in claim 18 further comprising:
storing, in a file on the computer, a list of the identified uninitialized memory elements; and
the simulating comprising reading the file to initialize the identified uninitialized memory elements.

22. The method as recited in claim 18 wherein processing the model comprises performing formal verification on the model.

23. The method as recited in claim 18 wherein processing the model comprises simulating the model over all input stimuli.

* * * * *

UNITED STATES PATENT AND TRADEMARK OFFICE
CERTIFICATE OF CORRECTION

| | | |
|---|---|---|
| PATENT NO. | : 8,718,998 B2 | Page 1 of 1 |
| APPLICATION NO. | : 13/050255 | |
| DATED | : May 6, 2014 | |
| INVENTOR(S) | : Nimrod Agmon | |

It is certified that error appears in the above-identified patent and that said Letters Patent is hereby corrected as shown below:

In the Claims:

In Claim 1, Column 8, Line 35, please delete "element" and substitute -- elements --

In Claim 2, Column 8, Line 44, please delete "element" and substitute -- elements --

In Claim 8, Column 9, Line 34, please delete "in claim 6" and substitute -- in claim 7 --

Signed and Sealed this
Seventh Day of October, 2014

Michelle K. Lee
*Deputy Director of the United States Patent and Trademark Office*